United States Patent [19]

Yamada

[11] Patent Number: 4,914,325
[45] Date of Patent: Apr. 3, 1990

[54] SYNCHRONIZING CIRCUIT
[75] Inventor: Kazuyoshi Yamada, Tokyo, Japan
[73] Assignee: NEC Corporation, Japan
[21] Appl. No.: 255,831
[22] Filed: Oct. 7, 1988
[30] Foreign Application Priority Data Oct. 9, 1987 [JP] Japan .................................. 62-255834

[51] Int. Cl.[4] ...................... H03K 3/013; H03K 3/027; H03K 19/003; H03K 5/05
[52] U.S. Cl. ..................................... 307/592; 307/595; 307/480; 307/516; 307/269; 307/272.1; 328/63
[58] Field of Search ................ 328/63; 307/272.1, 291, 307/292, 269, 494, 514, 516, 480, 592, 595

[56] References Cited

U.S. PATENT DOCUMENTS

| | | | |
|---|---|---|---|
| 3,471,790 | 10/1969 | Kaps ......................................... | 328/58 |
| 3,612,906 | 10/1971 | Kennedy ................................ | 307/269 |
| 4,001,611 | 1/1977 | Muruyama et al. ................... | 307/293 |
| 4,529,892 | 7/1985 | Reilly et al. ............................ | 307/269 |
| 4,675,558 | 6/1987 | Serrone et al. ........................ | 307/516 |
| 4,691,121 | 9/1987 | Theus .................................... | 307/269 |
| 4,745,302 | 5/1988 | Hanawa et al. ........................ | 307/63 |
| 4,758,737 | 7/1988 | Hirano ................................... | 307/269 |
| 4,760,291 | 7/1988 | Nakajima et al. ..................... | 307/480 |
| 4,771,441 | 9/1988 | Spengler et al. ....................... | 307/269 |
| 4,797,574 | 1/1989 | Okubo et al. .......................... | 307/269 |

FOREIGN PATENT DOCUMENTS

| | | | |
|---|---|---|---|
| 0047955 | 12/1982 | European Pat. Off. ............ | 307/494 |
| 0748831 | 7/1980 | U.S.S.R. .............................. | 307/514 |
| 1231596 | 5/1986 | U.S.S.R. .............................. | 307/514 |

OTHER PUBLICATIONS

McGuire, "A Simple Synchronizing Circuit", IBM Technical Disclosure Bulletin, vol. 3, No. 9, Feb. 1961.

Primary Examiner—Stanley D. Miller
Assistant Examiner—Nancy Thai
Attorney, Agent, or Firm—Laff, Whitesel, Conte & Saret

[57] ABSTRACT

A circuit for synchronizing data pulses, comprises a D-type flip-flop and a set-reset type flip-flop. The D-type flip-flop is enabled by a system clock pulse train wherein the D-type flip flop conducts to product an output at a time controlled by the system clock pulse train if a data pulse is present, thereby synchronizing the data pulse with the system clock. The set-reset flip-flop is enabled by a second clock pulse train which lags after the system clock pulse train. The lag period is long enough to suppress transient conditions counsel by the leading edges of the system clock pulses. The set-reset flip-flop drives the D-type flip-flop.

9 Claims, 3 Drawing Sheets

SYNCHRONIZING CIRCUIT

BACKGROUND OF THE INVENTION

The present invention relates to a synchronizing circuit and more particularly to a synchronizing circuit for synchronizing two mutually asynchronous input signals.

A prior art synchronizing circuit generally consists of a D-type flip-flop (hereinafter called "DFF") in which the state of an input signal is set by a clock pulse and maintained until a next clock pulse. The prior art synchronizing circuit, however, has a metastability problem because it falls into metastability when the transition of the state of the input signal is coincident with a rise of the clock pulse. Once the metastability occurs, the logic circuits using the output of the synchronizing circuit do not operate at all. Since the duration of the metastability if not predictable, it is impossible to properly design the timings of the system and the reliability of the logic system deteriorates excessively.

SUMMARY OF THE INVENTION

An object of the present invention is to provide a synchronizing circuit which is free from the metastability problem.

The synchronizing circuit of the present invention comprises, in addition to the conventional D-flip-flop "DFF", a set-reset-type flip-flop (hereinafter called an SR flip-flop or "SRFF"). An SRFF is set when the set input signal is "1" and reset when the reset input signal is "1". The SRFF and which maintains the previous state when the set and reset input signals are both "0". A delay circuit which delays the clock signal applied to the DFF in order to generate a control signal. Two gate circuits are controlled by the control signal and receive true and complementary signals of an input data signal, respectively. These gate circuits supply their outputs to the SRFF as set and reset input signals. The output of the SRFF is supplied to the DFF as an input signal.

Since the gate circuits are controlled by the control signal which is a delayed signal of the clock signal, the gate circuits are closed at the time when there is a transition of the clock signal in order to prohibit the data input from entering into the SRFF and as a result from entering into the DFF. They are opened by the control signal to allow the data input to be applied to the SRFF and DFF only when the clock signal is not in the transition state.

As described above, the synchronizing circuit according to the present invention takes the data input signal which is to be synchronized into the SRFF at a timing which never coincides with the state transition of the clock signal and transports the data to the DFF. Accordingly, the abnormal output state or the metastability due to the simultaneous change of the data input for the DFF and the clock input can be completely prevented. Thanks to this advantage, in a logic circuit or a system to which an asynchronous data signal is inputted, a timing design can be easily performed without any necessity of preventing the metastable behavior. Consequently, advantages can be obtained in which the most preferable design can be conducted and the functional reliability can be improved.

DESCRIPTION OF THE PRIOR ART

Figure 1:
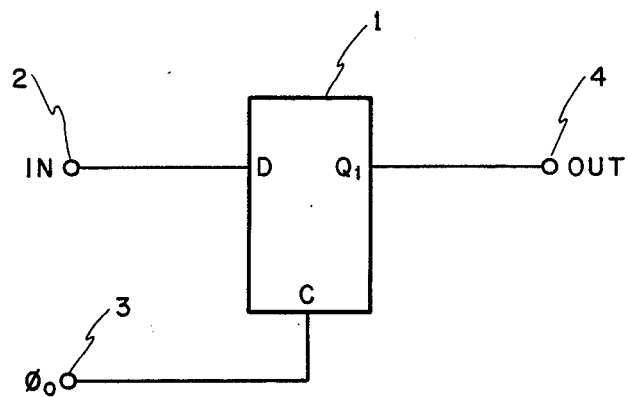
FIG. 1 shows a prior art synchronizing circuit.

Referring to FIG. 1, the prior art synchronizing circuit employs a DFF 1 which has a data input terminal 2, a clock input terminal 3 and a data output terminal 4. The state of the output signal OUT at the output terminal 4 is defined by the state of the input data signal IN at the rising edge of the clock pulse $\phi_0$ (FIG. 2) applied to the clock input terminal 3.

Figure 2:
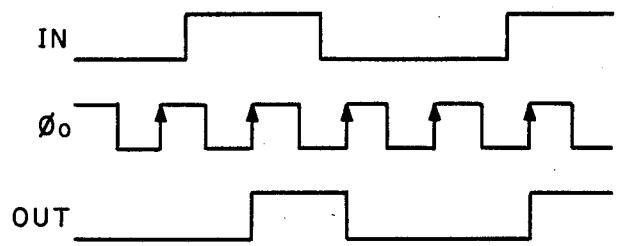
FIG. 2 is a timing chart illustrating the operations of the circuit of FIG. 1.

As shown in FIG. 2, the high level of the input signal IN at the rising edge of the clock signal $\phi_0$ turns the output OUT to the high level. The low level of IN, when $\phi_0$ rises, makes the low level appear at terminal out. Thus, the output OUT can be synchronized with the clock signal ($\phi_0$). When the leading (rising) edge of the clock pulse $\phi_0$ and the transition state of the data input IN are substantially coincident, however, the DFF circuit 1 may fall into a metastable or abnormal output condition, where the output OUT becomes unstable or is fixed at an intermediate level.

Figure 3:
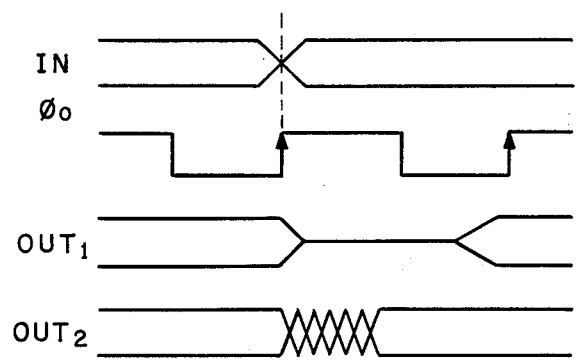
FIG. 3 is a timing chart illustrating the generation of the abnormal output in the circuit shown in FIG. 1.

FIG. 3 is a timing chart illustrating the generation of an abnormal output experienced with the prior art circuit 1. When the timing of the transition state of the data input IN (designated by a dashed line) and the leading edge of the clock pulse $\phi_0$ are coincident, the output signal abnormally takes an intermediate level as shown by $OUT_1$ or becomes unstable as shown by $OUT_2$.

DESCRIPTION OF THE PREFERRED EMBODIMENTS

Figure 4:
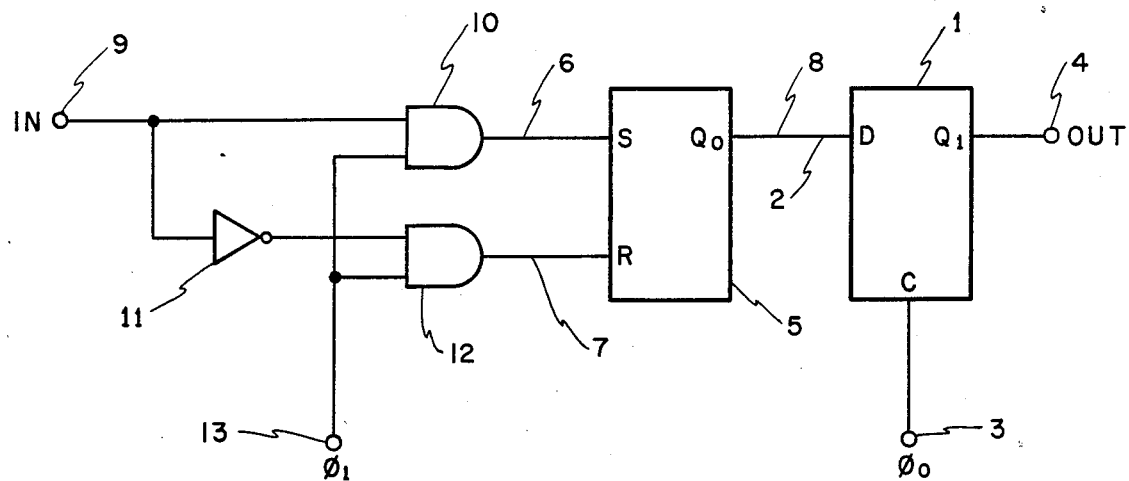
FIG. 4 shows a synchronizing circuit according to an embodiment of the present invention.

Referring to FIG. 4, the inventive synchronizing circuit comprises, the DFF 1 of FIG. 1, an SR flip-flop 5 having a set input terminal 6, a reset input terminal 7 and an output terminal 8 which is connected to the data input terminal 2 of the DFF 1. An input terminal 9 receives the input signal IN. A control signal terminal 13 receives a control signal $\phi_1$ which is generated by a circuit shown in FIG. 6. A first AND gate 10 is connected to the input terminal 9 and the control signal terminal 13 to receive the input signal IN and the control signal $\phi_1$. The output of first AND gate 10 is connected to the set input terminal 6 of the SRFF 5 to apply its (Gate 10) output to the SRFF 5. An inverter 11 is connected to the input terminal 9 to generate a complementary signal of the input signal IN. A second AND gate 12 has two inputs connected to the output of the inverter 11 and the control signal terminal 13 to receive the signal which is complementary to the input IN and the control signal $\phi_1$. Second gate 12 also has an output end connected to the reset input terminal 7 of the SRFF 5.

The input signal IN which is to be synchronized is inputted to the input terminal 9 and supplied directly to the first AND circuit 10 and also is supplied to the second AND circuit 12 via the inverter circuit 11. These true and complementary inputs are transferred through the AND gates 10 and 12 to the set terminal 6 and to the reset terminal 7 of the SR flip-flop 5 only when the control signal $\phi_1$ is supplied to the control signal terminal 13. The control signal $\phi_1$ is delayed with respect to the clock signal $\phi_0$ by a predetermined time period. Therefore the AND circuits 10 and 12 are disabled (closed) at or around a timing of the leading edge of the clock signal $\phi_0$ to prohibit the data signal IN, even if it changes, from being sent to the SFRR 5. As a result, a data signal in synchronization with the clock signal $\phi_0$ is output at the output terminal 4.

Figure 5:
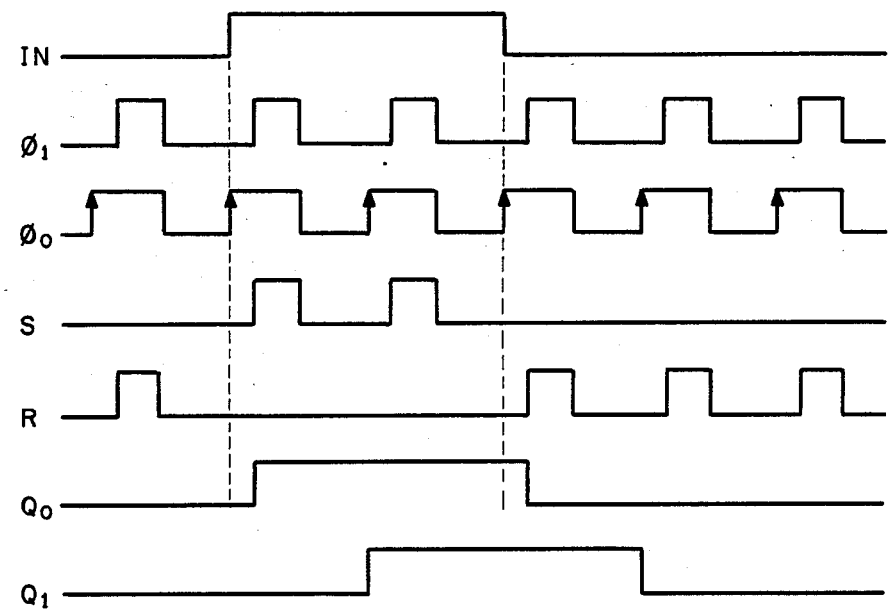
FIG. 5 is a timing chart illustrating operations of the circuit shown in FIG. 4.

Referring further to FIG. 5, in response to the control signal $\phi_1$, the output $Q_0$ at output 8 of the SRFF 5 always rises with a phase difference that is displaced from the leading edge of the clock signal $\phi_0$. This output signal $Q_0$ is supplied to the data input terminal 2 of the DFF 1 which is in turn controlled by the clock signal $\phi_0$. Therefore, the metastable behavior cannot occur in the circuit of FIG. 4. In a case where the transition regions of the data signal IN and the control signal $\phi_1$ overlap, a spike or a burst of spikes may be generated at the outputs of the AND circuits 10 and 12. Such a spike or a burst of spikes enters the SRFF 5 rather than the DFF 1. The SRFF 5 does not generate the abnormal output which has been conventionally generated by the DFF 1 in response to such spike signals.

Figure 6:
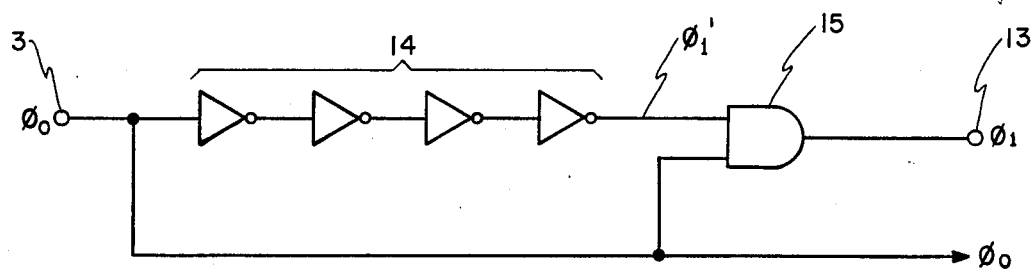
FIG. 6 shows a circuit which generates the control signal for the circuit of FIG. 4.

Referring to FIG. 6, the circuit for generating the control signal $\phi_1$ comprises a delay circuit 14 and an AND gate 15. The clock signal $\phi_0$ at the clock input terminal 3 is applied to the delay circuit 14 (four inverters here). Therefore, the output $\phi_1'$ of the delay circuit 14 rises at time $\Delta t'$ after the rise of the clock signal $\phi_0$, where $\Delta t'$ represents the signal propagation delay time provided by the delay circuit 14. In the embodiment of FIG. 6, the delay circuit output $\phi_1'$ is applied to the AND gate 15 which gives an output signal at the control signal terminal 13 this output is the control signal $\phi_1$ whose delay $\Delta t$ from the rise of $\phi_0$ is a little longer than $\Delta t'$.

Figure 7:
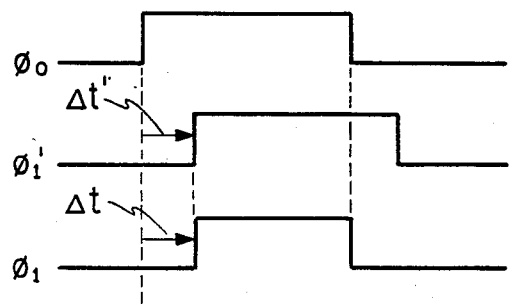
FIG. 7 is a timing chart illustrating the operations of the circuit shown in FIG. 6.

As shown in FIG. 7, the control signal $\phi_1$ is delayed by $\Delta t$ with respect to the clock signal $\phi_0$. The signal $\phi_1'$ may also be directly derived from the control signal terminal 13 as a control signal instead of $\phi_1$.

The signal propagation delay time $\Delta t$ (or $\Delta t'$) of the control signal $\phi_1$ (or $\phi_1'$) may be in a range defined below, where $t_D$ is a delay time from the input of the control signal $\phi_1$ at the terminal 13 (FIG. 4) to the rise of the output $Q_0$ of the SRFF 5.

$$t_H - t_D < \Delta t < T_{OK} - t_D - t_S,$$

where $t_S$ is the set-up time of the DFF 1 and $t_H$ is the hold-time of the DFF 1, while $T_{OK}$ is the period of the clock signal $\phi_0$.

The set-up time $t_s$ is a time necessary for the DFF 1 (FIG. 4) to be set by the data input D which appears at its data input terminal 2. For that purpose, the rise of the data input D should be earlier by at least time $t_s$ than the rise of the clock pulse $\phi_0$. The data input D should be held for at least $t_H$ (hold-timer) after the rise of the clock signal $\phi_0$. In an example of the synchronizing circuit realized by the use of a bipolar gate-array circuit time, $\Delta t$ is 2 to 3 nonosecond (ns), while time $t_D$ is 4 ns and time $t_s$ is less than 1 ns.

As described above, by thus structuring the synchronizing circuit, the timing-design of the circuit can be easily conducted, so that the most preferable design of the circuit can be easily obtained and the reliability can be improved.

In the above-described embodiment, the AND gates 10 and 12 are used as an example of an input gate circuit to the SR flip-flip 5. The similar input gate circuit may be structured by employing NOR gates or other gates.

Figure 8:
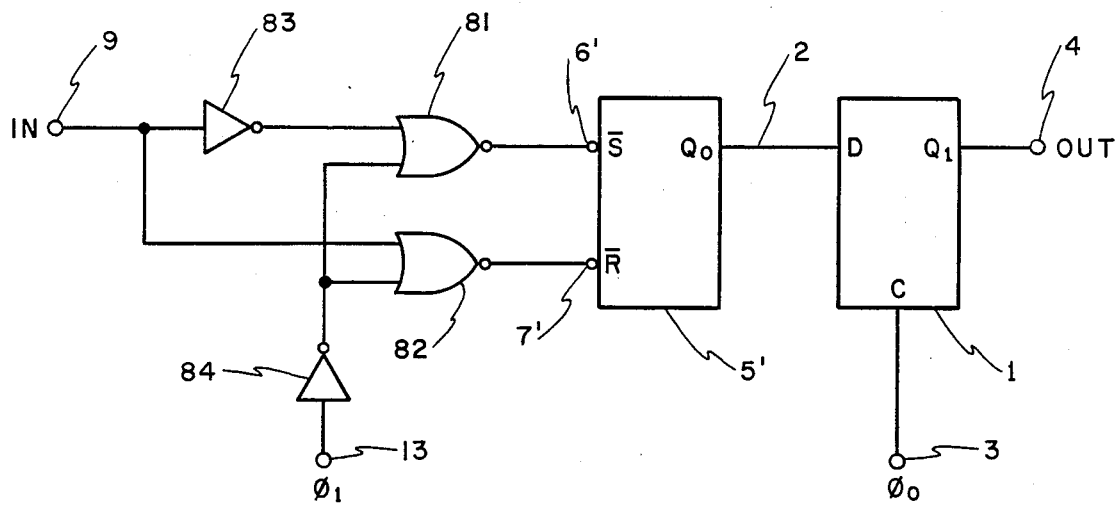
FIG. 8 shows a synchronizing circuit according to another embodiment of the invention.

FIG. 8 shows another embodiment in which two NOR gates 81 and 82 are used instead of the AND gates 10 and 12 in FIG. 4. An inverter 83 is inserted between the input terminal 9 and the NOR gate 81. Another inverter 84 is connected between the control signal terminal 13 and the two NOR gates 81, 82. An SR flip-flop 5' has an inverted set input ($\overline{S}$) terminal 6' and an inverted reset input ($\overline{R}$) terminal 7'. The other part of the circuit of FIG. 8 is the same as the corresponding part of FIG. 4.

I claim:

1. A synchronizing circuit comprising a data input terminal for receiving an input signal; an input gate circuit having an input end coupled to said data input terminal, having a control signal input end for receiving a control signal, and having first and second output ends; said input gate circuit outputting a first output data from said first output end in synchronism with said control signal when said input signal is applied to said data input terminal and when a second output data from said second output end is in synchronism with said control signal and when said input signal is not applied to said data input terminal; a clock terminal for receiving a lock signal; a delay circuit connected between said clock terminal and said control signal input end and delaying said clock signal to generate said control signal; an SR flip-flop having a set input end connected to said first output end, having a reset input end connected to said second output end, and having an output end; a D flip-flop having an input end connected to said output end of said SR flip-flop, having an output end, and having a clock end connected to said clock terminal; and an output terminal connected to said output end of said D flip-flop.

2. A synchronizing circuit comprising first flip-flop means, a source of clock signals for driving first flip-flop means, said clock signals sometimes developing transient conditions that may cause unstable or abnormal first flip-flop operations, logic circuit means jointly controlled by said clock signal and incoming data signals for applying said data signals to said first flip-flop, said logic circuit means for applying said data signals to said first flip-flop including a set-reset type flip-flop and including delay means for controlling said set-reset type flip-flop in response to said data signal, said flip-flop having a data terminal for receiving said data signals via said set-reset type flip-flop, a control terminal for receiving said clock signals, and an output terminal for delivering said repeated signal, the repeated signal being defined by the signal on said data terminal when said clock pulse appears at said control terminal, and said logic circuit means further includes gate means or delaying an application of said data signal to said set-reset type flip-flop until after said period subject to paid transient conditions subside.

3. The synchronizing circuit of claim 2 wherein said logic circuit comprises two AND gates each having two inputs, a first of said two inputs on each of said AND gates being coupled to be energized by a delayed train of said clock pulses, a second input on a first of said AND gates being coupled to receive said data signals, a second input on the other of said AND gates being coupled to receive inverted data signals, means responsive to said first AND gate for setting said set-reset flip-flop, and means responsive to said second AND gate for resetting said set-reset flip-flop whereby said data signals are applied to said first flip-flop during a period started by a clock pulse in said delayed train and continuing during the interval defined by said clock pulse and said inverted clock pulse.

4. The synchronizing circuit of claim 3 wherein said transient condition is caused by and occurs within a period of time following leading edges of said clock pulses, and said delayed train of said clock pulses provides a second series of clock pulses which occur said period of time after the leading edges of said clock pulses.

5. A synchronizing circuit comprising a source of a system clock pulse train, input terminal means for receiving data pulses which may be out of synchronism with said system clock pulse train, means responsive to said system clock pulse train for repeating said data pulses at an output terminal whereby said repeated signals are synchronized with said system clock pulse train, and means responsive to said system clock pulse train for suppressing unstable conditions which are associated with leading edges of said clock pulses.

6. The circuit of claim 5 wherein said repeating means is a D-type flip-flop, and said means for suppressing unstable conditions is a set-reset type flip-flop coupled between said input terminal and said D-type flip-flop.

7. The circuit of claim 6 wherein said D-type flip-flop is enabled by said system clock pulse train and said set-reset type flip-flop is enabled by a second clock pulse train which is delayed relative to said system clock pulse train by a period which is at least as long as said unstable conditions following said leading edges.

8. A synchronizing circuit as claimed in claim 1, wherein said input gate circuit comprises an invertor having an input end connected to said input end of said input gate circuit and having an output end; a first AND gate having a first input end connected to said input end of said input gate circuit, having a second input end connected to said control signal input end, and having an output end connected to said first output end; and a second AND gate having a third input end connected to said output end of said invertor, having a fourth input end connected to said control signal input end, and having an output end connected to said second output end.

9. A synchronizing circuit as claimed in claim 1, wherein said input gate circuit comprises a first inverter having an input end connected to said input end of said input gate circuit, and having an output end; a second inverter having an input end connected to said control signal input end, and having an output end; a first NOR gate having a first input end connected to said output end of said first inverter; having a second input end connected to said output end of said second inverter, and having an output end connected to said first output end; and a second NOR gate having a third input end connected to said input end of said input gate circuit, having a fourth input end connected to said output end of said second inverter, and having an output end connected to said second output end.

* * * * *